United States Patent [19]

Tavares et al.

[11] Patent Number: 4,611,399
[45] Date of Patent: Sep. 16, 1986

[54] CONNECTOR PIN ALIGNMENT TOOL AND METHOD FOR ALIGNING

[75] Inventors: Antonio Tavares; Trevor Martin, both of San Jose, Calif.

[73] Assignee: Storage Technology Partners, Santa Clara, Calif.

[21] Appl. No.: 558,684

[22] Filed: Dec. 6, 1983

[51] Int. Cl.⁴ .................. H01R 43/20; B23P 19/00
[52] U.S. Cl. ........................... 29/876; 29/747; 72/403; 140/147
[58] Field of Search ............... 29/884, 837, 759, 827, 29/758, 741, 747; 140/147; 174/138 G; 72/403; 339/17 LC

[56] References Cited

U.S. PATENT DOCUMENTS 3,520,335  7/1970  Patterson .................. 72/403 X
4,328,613  5/1982  Kirkpatrick ............... 29/741 X

FOREIGN PATENT DOCUMENTS 1416299  12/1975  United Kingdom ............... 140/147

Primary Examiner—Howard N. Goldberg
Assistant Examiner—Carl J. Arbes
Attorney, Agent, or Firm—Woodcock Washburn Kurtz Mackiewicz & Norris

[57] ABSTRACT

A tool for aligning the leads or pins of a connector while they are inserted in the holes of the electronic package to which the connector will be attached is described. Guide rails, which are attached to a fixed-block on one end and a removable slidable block at the other end, are placed between the leads to align them in one direction. A comb having protruding teeth is positioned so that the teeth are placed between the leads in a direction perpendicular to the guide rails. The guide rails and teeth align and constrain the leads in the same pattern as the holes of the package and a clamp holds the guide rails and teeth in place. After the leads have been started to be inserted in the holes of the electronic package the comb is removed. The slidable block is removed from one end of the guide rails, and the guide rails are pulled out of their position between the leads. The connector leads are then fully inserted into the holes.

4 Claims, 4 Drawing Figures

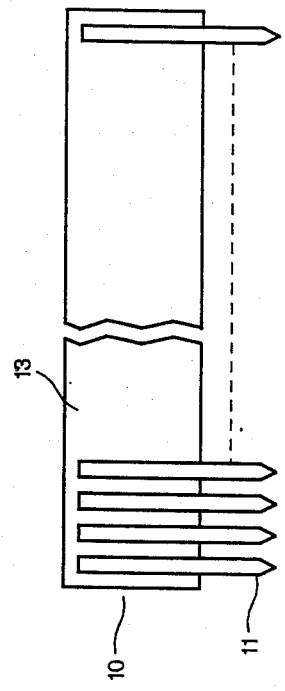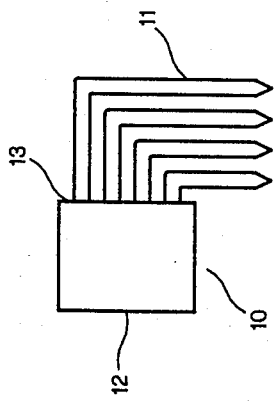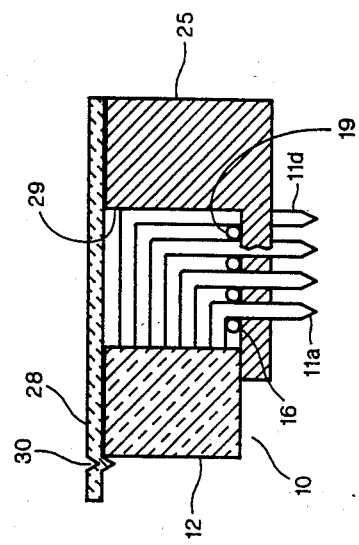

CONNECTOR PIN ALIGNMENT TOOL AND METHOD FOR ALIGNING

BACKGROUND OF THE INVENTION

This invention relates to a connector alignment tool. More particularly, it relates to a tool that aligns and constrains the leads of a connector while the leads are inserted in the holes of the electronic package to which the connector is to be attached.

Electronic products usually consist of several levels of packages. The first level package is the semiconductor or integrated circuit (IC) package. These packages are affixed in some manner, usually by soldering, to the second level package.

The second level package, usually a printed circuit board, mechanically supports the first level packages and electrically interconnects them by means of the printed traces of the board. The second level package has some form of connector attached to it which is plugged into a mating connector on the third level of packaging.

The third level of packaging, typically called a backplane, generally consists of a printed circuit board with a number of connectors attached thereto. The printed traces of the printed circuit board interconnect the second level packages when they are plugged into the connectors of the third level package. The third level of packaging may also include mechanical elements to provide mechanical support for the second level packages. Depending upon the size and complexity of the electronic product, additional levels of packaging may be used.

As integrated circuit (IC) technology has advanced to what is now called large scale integration (LSI) and very large scale integration (VLSI), the number of electronic functions that can be performed by a first level package has increased dramatically. This has required that the number of input/output (I/O) pins, or leads, on the first level package be increased in order to utilize the increased capability. Further, when LSI or VLSI IC's are used, the number of I/O connections required on the second level package increases. For example, second level packages with more than a thousand I/O connections are now being used.

In the electronics industry, it is advantageous to keep the size of each level of packaging as small as practical. Thus, as the need for more I/O pins on the second level package has increased, smaller and more dense connectors have been developed. (In this discussion, the term "pin" is used for either of the two mating parts of a connection, e.g., for both a pin and a socket.) It is known in the art to use connectors with 400 pins arranged in four rows of 100 each, with 0.050 inch spacing between rows, and between pins in the rows.

Such multi-pin connectors utilize pins that are typically formed from a copper alloy and then plated with a thin layer of gold approximately 30 micro-inches thick. The copper gives good electrical conductivity, the alloying metal adds some strength, and the gold plating prevents oxidation which would increase contact resistance. The pins are inserted in the holes of a molded connector body which is made of plastic or of some other suitable material. The pin is formed such that when inserted in the connector body, it cannot be removed without the use of a special tool. A portion of the pin, called the lead, protrudes from the connector body. The protruding leads of all the pins are inserted into plated through holes of the printed circuit board of the second level package (or an equivalent connector of any level of packaging) and soldered or otherwise bonded or secured in their inserted position.

Disadvantageously, the pins are not rigidly held within the connector body. By design, at least the detached end of the leads, and often the socket too, must be free to move slightly so that when two connectors are engaged, the pins of the two connectors can move as they mate together. Without this ability to move slightly, one or both of the pins may be damaged due to a slight misalignment between them. Unfortunately, this means that even though the holes of the connector body and the holes of the printed circuit board are formed in the same pattern, the ends of the leads which must be inserted into the holes of the printed circuit board or other mating connector are not necessarily in the same pattern.

In the prior art, this misalignment between the ends of the leads and the holes of the printed circuit board or other connector adds considerably to the assembly cost of the package. During assembly, extreme care must be taken to ensure that all the leads are in line with the appropriate hole before applying force to insert the leads. In the past, this has been done by placing the leads over the holes and jiggling the connector while adjusting the position of the ends of the leads. The process is very time consuming because of the number of leads involved and their close spacing. In the case of the 400 pin connector described above, the process of aligning all the leads before inserting them into the holes of a printed circuit board has taken as long as three hours.

Adversely, the leads, being made of a copper alloy, are relatively easy to bend. If force is applied to the connector to insert the leads into the holes while some of the leads are still misaligned, those leads will be bent. This means that the connector must be removed, the bent leads straightened, and the process started over. Also, the forces exerted on the leads as they bend may push the pin against the connector body and damage the pin within the connector body. This may require that the expensive connector be discarded. Even worse, the damaged pin may not be noticed. In that case, the connector would be soldered to the printed circuit board and may damage its mating pin when the connector is engaged with another connector. If this happens, then two connectors must be removed and repaired, or replaced.

It is evident therefore that a need exists in the art for a tool that aligns the leads of a connector while they are inserted into the holes of the package to which the connector is to be attached. Such a tool is needed to lower the assembly cost. The assembly cost may be lowered by reducing the assembly time, and by reducing the damage caused to the connectors during the assembly process.

SUMMARY OF THE INVENTION

It is an object of the present invention to provide a tool that aligns the leads of an electrical connector with respect to the holes into which they will be inserted.

It is also an object of the present invention to provide such a tool that significantly reduces the assembly cost associated with mating the pins of connectors having a large number of pins.

A still further object of the invention is to provide such a tool which can be readily removed from the connector after the leads are partially inserted into the holes, whereupon the leads may be fully inserted into their respective holes.

The above and other objects of the invention are realized through the use of a tool that includes spaced-apart parallel guide rails; a slide-block adapted to be slidably removed from one end of the guide rails; a comb having spaced apart parallel teeth, which teeth are substantially orthogonal to said guide rails, although in a different plane from said guide rails; and a clamping mechanism. A plurality of guide rails, the quantity being determined by the number of rows of leads on the connector, have one end attached to a fixed-block. The free ends of the guide rails are placed between the rows of leads at one end of the connector and pushed through the rows until the fixed-block is against the end of the connector body. The slide-block, which has a plurality of holes of the appropriate size and spacing, is pushed onto the ends of the guide rails which protrude beyond the other end of the connector body until it is against that end of the connector body. The slide block ensures that the rails are parallel and the size and spacing of the guide rails are such that the leads are thus aligned into straight rows.

The comb is a length of material which has an "L" shaped cross section with one leg of the "L" resembling a comb. That is, it has a multiplicity of spaced-apart parallel teeth protruding therefrom. There are as many spaces between the teeth as there are columns of leads on the connector. The size of the teeth and that of the spaces is determined by the connector being used.

The teeth of the comb are pushed between the leads that extend through the guide rails until the solid leg of the "L" is against the long dimension of the connector body. That is, the teeth are at a right angle to the guide rails.

The clamping mechanism includes a strip of resilient material, such as spring steel, of the appropriate length that is attached to the top of the comb material. The free end of the resilient material has a slight bend in it such that when the solid leg of the "L" is against the connector body, the bend in the clamp is gripping the opposite side of the connector body.

The connector body is thus constrained by the fixed-block on one end and the slide-block on the other end. It is also constrained by the solid leg of the comb material on one side and by the clamp on the other side. The leads are aligned in rows by the guide rails and into their proper position within the rows by the teeth of the comb.

Once the connector leads are aligned and held in their aligned position as above-described, the tool can be picked up and the aligned and constrained leads can be partially inserted into the holes of the mating connector or package. When the leads are partially inserted, the comb can be removed and the leads can be inserted further into the holes. The slide-block can then be pulled off of the guide rails and the guide rails can be removed from between the leads by pulling the fixed-block away from the connector body. With the guide rails out, the leads can be fully inserted into the holes.

BRIEF DESCRIPTION OF THE DRAWINGS

The above and other objects, features, and advantages of the present invention will be better understood by referring to the following description of the preferred embodiment, presented in conjunction with the following drawings, wherein:

FIGS. 1a and 1b are an end view and a side view, respectively, of a typical multi-pin connector;

FIG. 3 is a cross-sectional view showing how the various components of the invention and a multi-pin connector fit together when the invention is in use.

DESCRIPTION OF THE PREFERRED EMBODIMENT

Figure 2:
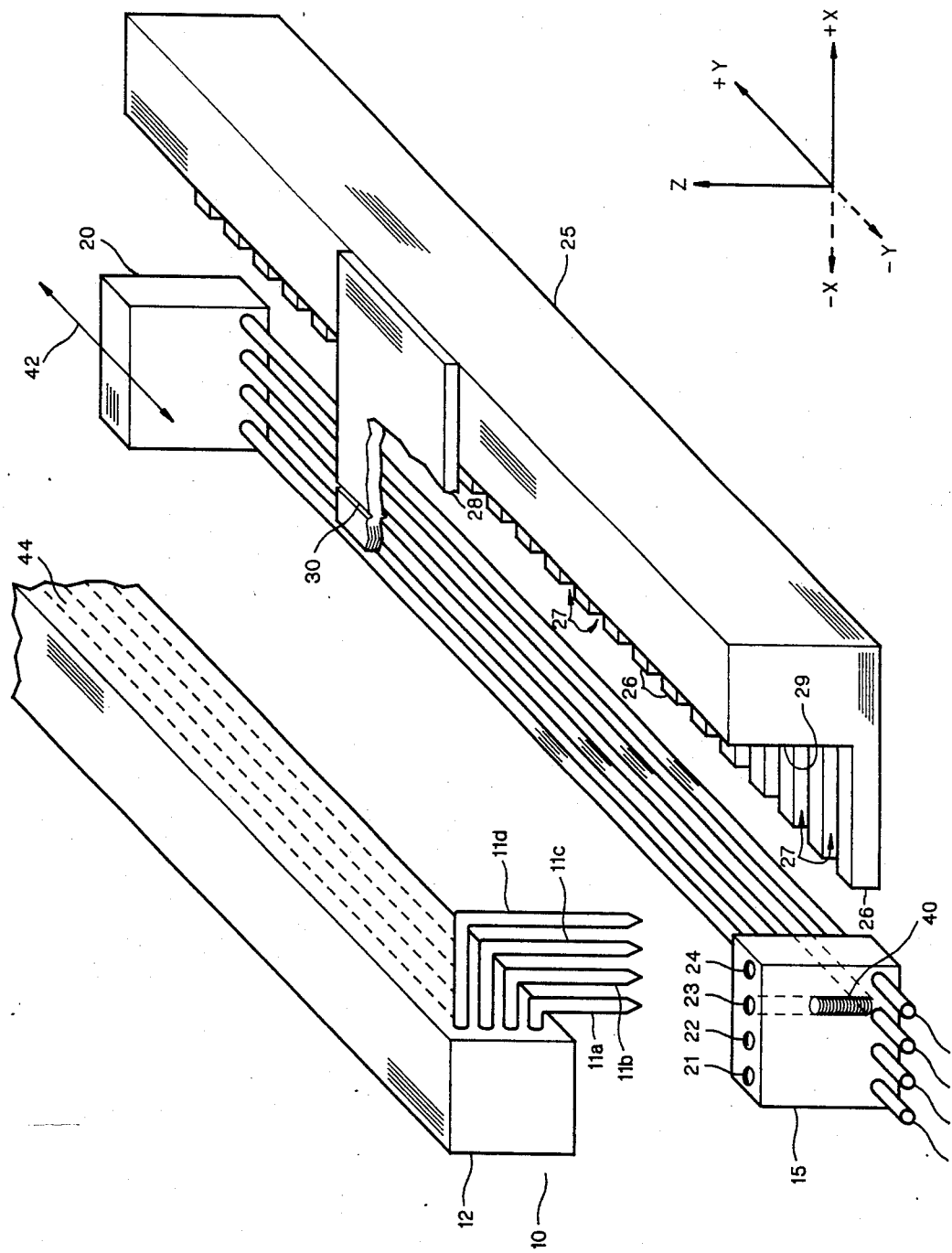
FIG. 2 is a perspective view showing the various components of the invention along with a connector, and their relationship to each other.

The following is a description of the best presently contemplated mode of carrying out the present invention. This description is given only to illustrate the general principles of the invention and is not to be taken in a limiting sense. To ascertain the true scope of the invention, refer to the appended claims.

FIGS. 1a and 1b are an end view and side view, respectively, of a typical multi-pin connector. The connector body 10 holds a multiplicity of pins whose leads 11 protrude from one surface 13 of the body 10. Other pins, not shown in the figure, are in the opposite side 12 of the body 10. The connector shown in the figure has four rows of leads, each row being bent at a right angle. The connector is shown only for illustrative purposes. The principles of the invention can be applied if the leads are straight or bent and regardless of the number of rows or leads. What is important is that in connectors of this type, the detached ends of the leads 11 are free to move some amount and that, therefore, the ends will not necessarily be in the same orderly array as the holes into which they are to be inserted.

FIG. 2 is a perspective view showing the various components of the invention, including a connector, and their relationship to each other. Four guide rails 16–19 are attached to a fixed-block 15 by means of set-screws in the tapped holes 21–24. One such set screw 40 is shown in hole 23, although all the holes contain similar set screws. At the opposite end of the guide rails 16–19 is a slide-block 20. The slide-block 20 may slide back and forth in the Y direction as shown by the arrow 42. Shown above the guide rails is a typical connector body 10 with a multiplicity of leads 11. For simplicity, only the end group of leads 11a, 11b, 11c, and 11d are shown, but it is to be understood that similar groups of leads run along the entire face 44 of the connector body 10.

A comb 25 is shown to the right of the guide rails. A multiplicity of parallel teeth 26 are separated by spaces 27. In the preferred embodiment, there are as many spaces 27 in the comb as there are columns of leads 11 on the connector. (A column of leads is a group of leads having the same Y axis coordinates, such as the group of leads 11a, 11b, 11c, and 11d.) A clamping mechanism 28 is attached to the comb 25. Also shown in the figure is an XYZ coordinate system to aid in the description of the invention.

To align the leads 11, the slide-block 20 is first removed from the guide rails 16–19 by pulling it in the +Y direction. The free ends of the guide rails are then placed between the leads 11 at the −Y end of the connector. This is done such that lead row 11a is between guide rails 16 and 17, lead row 11b is between guide rails 17 and 18, lead row 11c is between guide rails 18 and 19, and lead row 11d is on the +X side of guide rail 19. The fixed-block 15 is then pushed in the +Y direction to move the guide rails 16–19 through the rows of pins 11. When the +Y side of the fixed-block 15 is against the −Y end of the connector body 10, the guide rails 16–19 protrude from the +Y end of the row of leads. The slide-block 20 is then placed on the +Y end of the guide rails 16–19 and moved in the −Y direction until it contacts the +Y end of the connector. The slide-block keeps the guide rails parallel to each other and constrains the connector body between itself and the fixed-block.

After the guide rails have been installed, the comb 25 is put in place. This is done by placing the comb under the guide rails and moving in the −X direction such that each of the short rows of leads in the X direction 11a–11d (i.e., the columns of leads) fits into a space 27 with a tooth 26 therebetween. The comb is moved in the −X direction until the surface 29 of the comb 25 is against the side of the lead 11d. When this occurs, the clamp 28 engages the side 12 of the connector body 10 (this is shown best in FIG. 3).

The size and spacing of the guide rails 16–19 are designed such that when installed as described above, the leads can only move a few thousandths of an inch in the plus or minus X direction. Similarly, the size of the teeth 26 and the space 27 are designed to allow only a few thousandths of an inch movement in the plus or minus Y direction. Thus, the invention aligns the leads of the connector to within a few thousandths of an inch of the "ideal" position.

FIG. 3 is a cross-sectional view of the invention taken through the middle of the comb 25 (cut in the X-Z plane) after the guide rails and comb have been added to the connector as described above. The details of the clamp 28 are shown. A small bend 30 in the clamp material holds the connector body 10 in place. In the preferred embodiment, the clamp material is made from spring steel. Also shown in FIG. 3 is how the surface 29 of the comb 25, in conjunction with the guide rail 19, align the lead 11d.

It is to be emphasized that the principles of the invention described herein can be applied to any type of connector, as long as their leads are arranged in an orderly array. For example, if a connector had four rows of leads that extended straight out from the connector body without a right angle bend, then a set of five guide rails would be used so that each row of leads fitted between two rails. The surface 29 of the comb 25 would then butt against the side of the connector body, instead of against a lead as described above, and the length of the clasp would have to be changed.

When the leads have been aligned as described above, the tool, with the connector clamped in place, can be positioned over the holes into which the leads are to be inserted. Since the leads are aligned to within a few thousandths of an inch, it is a relatively simple matter to start all of them into their respective holes. When the leads are started into the holes, the comb can be removed by sliding it in the +X direction (refer to FIG. 2) and the leads inserted further into the holes. The slide-block 20 is removed by pulling it in the +Y direction. The guide rails are then removed by pulling the fixed-block 15 in the −Y direction. The leads can then be fully inserted into the holes.

What is claimed is:

1. In an electronic manufacturing assembly process wherein an electrical connector has a multiplicity of protruding leads arranged in an orderly array, but wherein the detached end of each said lead is free to move some amount from its position in said array, and wherein said leads must be inserted into a multiplicity of fixed holes which are positioned in a pattern corresponding to said array as part of said assembly process, a tool for aligning and constraining said leads to remain aligned with said array positions while said leads are inserted into said holes, said tool comprising:

a plurality of guide rails having their first ends attached to a fixed block, said guide rails fitting between said leads in a first direction, thereby aligning said leads in said first direction when said guide rails are inserted between said leads;

a comb having a multiplicity of teeth, said teeth fitting between said leads in a second direction below and in contact with said guide rails, thereby aligning said leads in said first and second directions when said guide rails and said teeth are inserted between said leads; and clamping means for holding said guide rails and said teeth in their respective inserted positions while said leads are startably inserted into their respective holes.

2. The alignment tool of claim 1 wherein said clamping means comprises:

a removable slide-block having holes for slidably inserting the free ends of said guide rails therein, whereby said connector may be securely positioned between the fixed block and said slide-block; and a protruding detachable latch mechanism attached to said comb, the protruding end thereof clamping said connector against an edge of said comb, whereby said teeth are maintained in their inserted position for so long as said latch mechanism is clamped to said connector.

3. The alignment tool of claim 1 wherein said first and second directions are substantially perpendicular to each other, each direction lying in a plane parallel to the other plane.

4. A method for quickly and easily aligning the pins or leads of a connector with a set of sockets or holes of a mating member without causing damage to said pins or leads, the pens or leads of said connector comprising protruding leads that are arranged in an orderly array, the detached ends of said leads being free to move in order to allow each to be aligned with its respective mating socket or hole, said method comprising the steps of:

(a) constraining the movement of the detached end of said leads in a first direction by inserting spaced-apart parallel guide rails in between the leads of said array;

(b) constraining the movement of the detached end of said leads in a second direction that is substantially orthogonal to said first direction by inserting spaced-apart parallel teeth in between the leads of said array;

(c) partially inserting the constrained leads of the first connector in the sockets of the second connector;

(d) removing the constraints imposed by steps (a) and (b); and (e) fully inserting the leads of the connector in the holes or sockets of the mating member.

* * * * *